(12) United States Patent
Hsu (10) Patent No.: US 7,679,421 B1
(45) Date of Patent: Mar. 16, 2010

(54) LEVEL SHIFT CIRCUIT

(75) Inventor: Kuo-Jen Hsu, Taipei (TW)

(73) Assignee: Ili Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 12/277,259

(22) Filed: Nov. 24, 2008

(30) Foreign Application Priority Data

Aug. 25, 2008    (TW) ............................. 97132356 A (51) Int. Cl.
*H03L 5/00* (2006.01)
(52) U.S. Cl. ..................... 327/333; 326/80; 326/82; 365/189.11
(58) Field of Classification Search ............... 327/333; 326/80–83; 365/189.11
See application file for complete search history.

(56) References Cited

U.S. PATENT DOCUMENTS

2008/0136489 A1*    6/2008    Nojiri ..................... 327/333

2008/0265970 A1*   10/2008    Vlasenko ................. 327/333

* cited by examiner

*Primary Examiner*—Long Nguyen
*Assistant Examiner*—Shikha Goyal
(74) *Attorney, Agent, or Firm*—Winston Hsu (57) ABSTRACT

The present invention provides a level shift circuit capable of operating at low input voltage. The level shift circuit comprises: a first switch element coupled to a first output terminal, a second switch element coupled to a second output terminal, a third switch element coupled to the second output terminal and the first output terminal, a fourth switch element coupled to the first output terminal and the second output terminal, a first current source module for letting a current passing through the third switch element smaller than a current passing through the first switch element when the first switch element and the third switch element are conducted, and a second current source module for let a current passing through the fourth switch element smaller than a current passing through the second switch element when the second switch element and the fourth switch element are conducted.

11 Claims, 6 Drawing Sheets

LEVEL SHIFT CIRCUIT

BACKGROUND OF THE INVENTION

1. Field of the Invention

The present invention relates to a level shift circuit, and more particularly, to a level shift circuit which is capable of operating at a low input voltage level.

2. Description of the Prior Art

Figure 1:
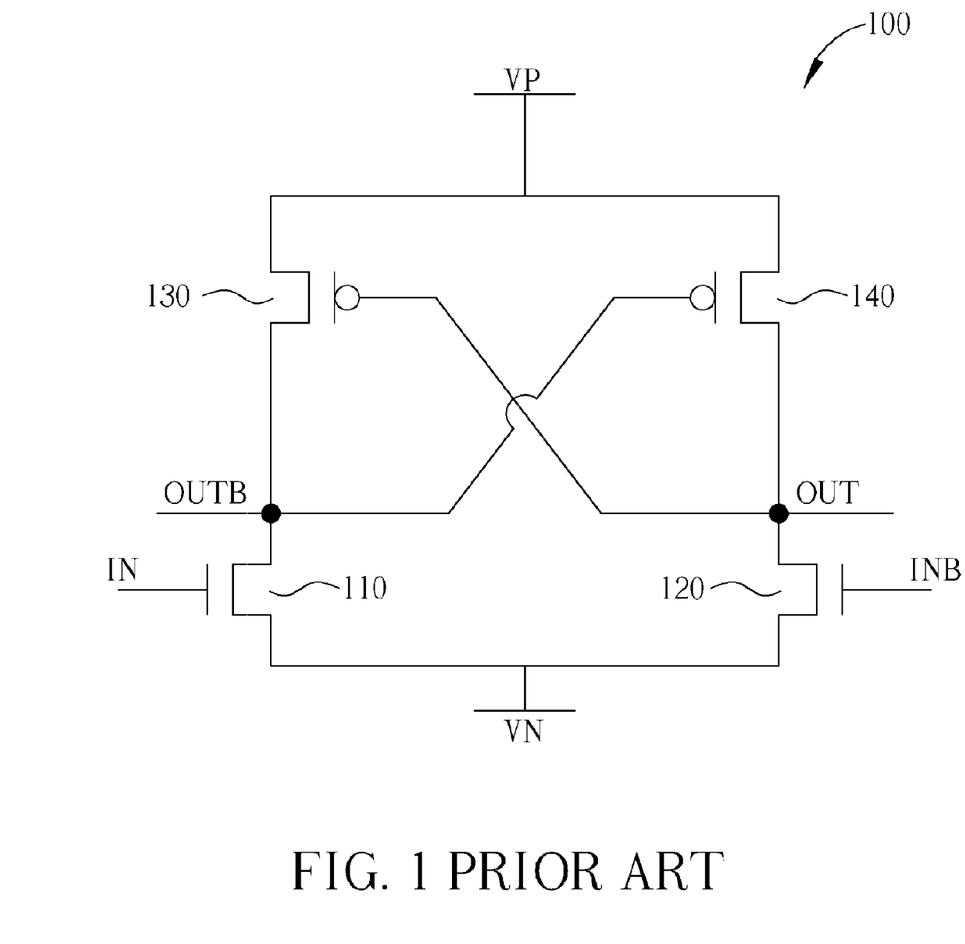
FIG. 1 shows a simplified block diagram of a conventional level shift circuit in accordance with a prior art.

In general, a level shift circuit is utilized for transiting an input voltage into a different output voltage. Please refer to FIG. 1. FIG. 1 shows a simplified block diagram of a conventional level shift circuit 100 in accordance with a prior art. As shown in FIG. 1, the level shift circuit 100 comprises: a first switch element 110, a second switch element 120, a third switch element 130, and a fourth switch element 140, wherein a voltage level of a first voltage source VN is lower than a voltage level of the second voltage source VP. In addition, the first switch element 110 and the second switch element 120 both are N-type FETs, and the third switch element 130 and the fourth switch element 140 both are P-type FETs, and the level shift circuit 100 is a level pull-up circuit. However, under a condition of the level shift circuit 100 operating at a low input voltage level, a current passing through the third switch element 130 is far greater than a current passing through the first switch element 110 when the first switch element 110 and the third switch element 130 are conducted, and a current passing through the fourth switch element 140 is far greater than a current passing through the second switch element 120 when the second switch element 120 and the fourth switch element 140 are conducted. This phenomenon results in the output voltages having no transitions, and thus level shift circuit 100 is not capable of operating at a low input voltage level.

Figure 2:
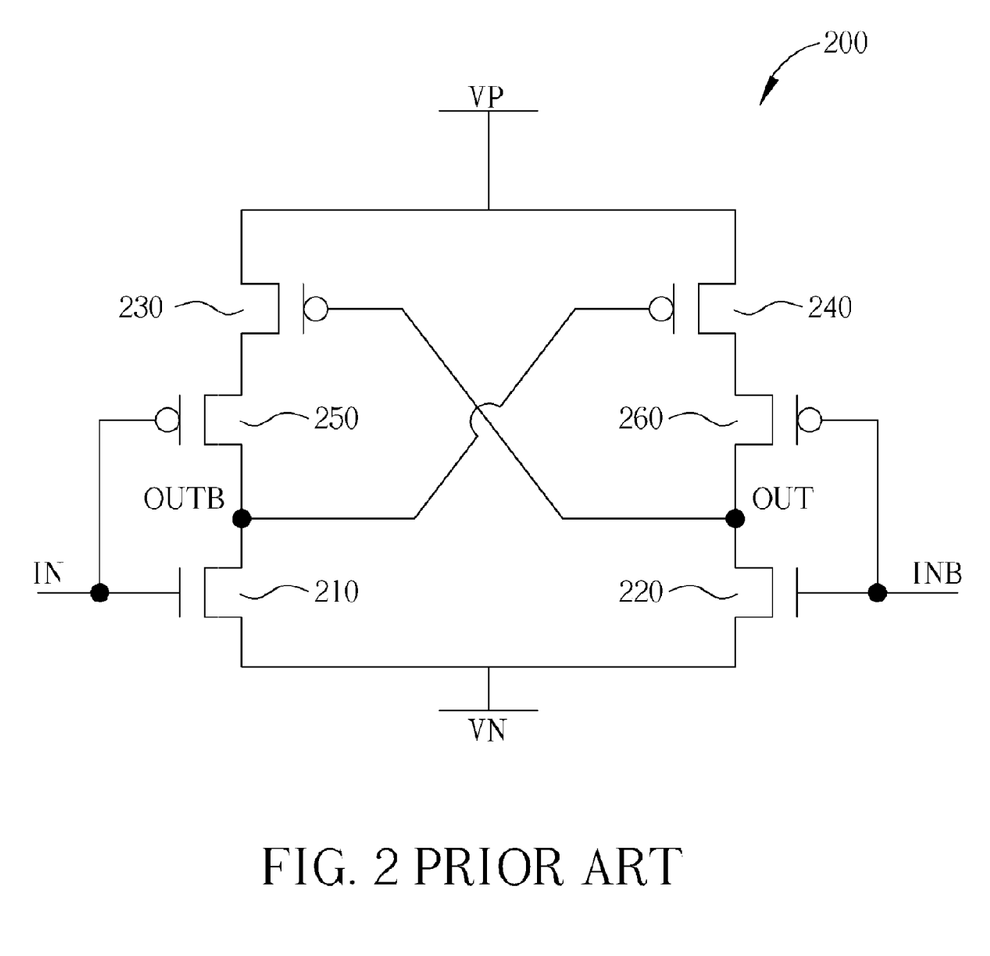
FIG. 2 shows a simplified block diagram of another conventional level shift circuit in accordance with a prior art.

Please refer to FIG. 2. FIG. 2 shows a simplified block diagram of another conventional level shift circuit 200 in accordance with a prior art. As shown in FIG. 2, the level shift circuit 200 comprises: a first switch element 210, a second switch element 220, a third switch element 230, a fourth switch element 240, a fifth switch element 250 and a sixth switch element 260, wherein a voltage level of a first voltage source VN is lower than a voltage level of the second voltage source VP. In addition, the first switch element 210 and the second switch element 220 both are N-type FETs, and the third switch element 230, the fourth switch element 240, the fifth switch element 250 and the sixth switch element 260 all are P-type FETs, and the level shift circuit 200 is a level pull-up circuit. However, under a condition of the level shift circuit 200 operating at a low input voltage level, a current passing through the third switch element 230 is far greater than a current passing through the first switch element 210 when the first switch element 210 and the third switch element 230 are conducted, and a current passing through the fourth switch element 240 is far greater than a current passing through the second switch element 220 when the second switch element 220 and the fourth switch element 240 are conducted. This phenomenon results in the output voltages having no transitions, and thus level shift circuit 200 is not capable of operating at a low input voltage level.

SUMMARY OF THE INVENTION

It is therefore one of the objectives of the present invention to provide a level shift circuit which is capable of operating at a low input voltage level, so as to solve the above problem.

In accordance with an embodiment of the present invention, a driving circuit is disclosed. The level shift circuit comprises: a first switch element, a second switch element, a third switch element, a fourth switch element, a first current source module, and a second current source module. The first switch element has a control terminal coupled to a first input signal, a first terminal coupled to a first voltage source, and a second terminal coupled to a first output terminal. The second switch element has a control terminal coupled to a second input signal, a first terminal coupled to the first voltage source, and a second terminal coupled to a second output terminal, wherein the second input signal is an inverse of the first input signal. The third switch element has a control terminal coupled to the second output terminal, a first terminal, and a second terminal coupled to the first output terminal. The fourth switch element, having a control terminal coupled to the first output terminal, a first terminal, and a second terminal coupled to the second output terminal. The first current source module is coupled between a second voltage source and the first terminal of the third switch element, and is utilized for letting a current passing through the third switch element smaller than a current passing through the first switch element when the first switch element and the third switch element are conducted. The second current source module is coupled between the second voltage source and the first terminal of the fourth switch element, and is utilized for letting a current passing through the fourth switch element smaller than a current passing through the second switch element when the second switch element and the fourth switch element are conducted.

Briefly summarized, the driving circuit disclosed by the present invention is capable of letting transitions of the output voltages of the first output terminal and the second output terminal occur successfully when the level shift circuit operates at a low input voltage level.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 3:
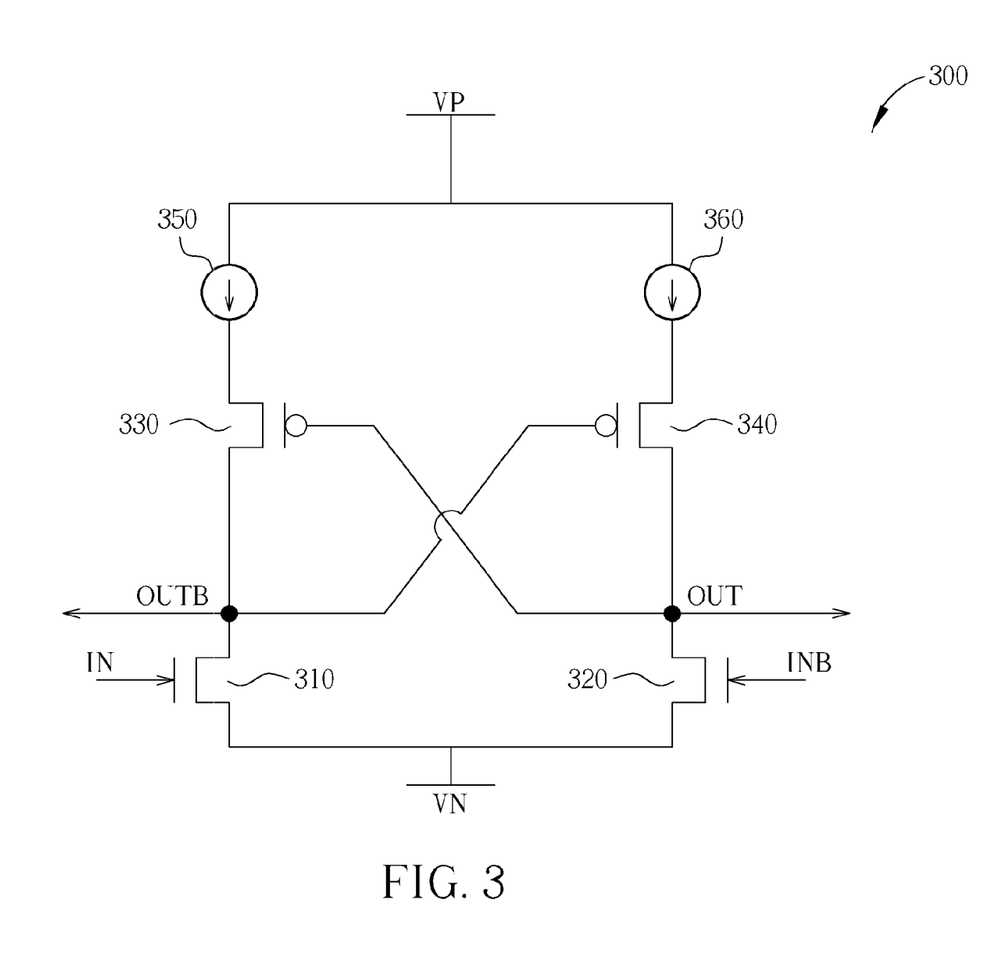
FIG. 3 shows a simplified block diagram of a level shift circuit in accordance with a first embodiment of the present invention.

Please refer to FIG. 3. FIG. 3 shows a simplified block diagram of a level shift circuit 300 in accordance with a first embodiment of the present invention. As shown in FIG. 3, the level shift circuit 300 comprises: a first switch element 310, a second switch element 320, a third switch element 330, a fourth switch element 340, a first current source module 350, and a second current source module 360, wherein a voltage level of a first voltage source VN is lower than a voltage level of the second voltage source VP. In addition, the first switch element 310 and the second switch element 320 both are N-type FETs, and the third switch element 330 and the fourth switch element 340 both are P-type FETs, and the level shift circuit 300 is a level pull-up circuit.

The first switch element 310 has a control terminal (i.e. a gate terminal) coupled to a first input signal IN, a first terminal (i.e. a source terminal) coupled to a first voltage source VN, and a second terminal (i.e. a drain terminal) coupled to a first output terminal OUTB. The second switch element 320 has a control terminal (i.e. a gate terminal) coupled to a second input signal INB, a first terminal (i.e. a source terminal) coupled to the first voltage source VN, and a second terminal (i.e. a drain terminal) coupled to a second output terminal OUT, wherein the second input signal INB is an inverse of the first input signal IN. The third switch element 330 has a control terminal (i.e. a gate terminal) coupled to the second output terminal OUT, a first terminal (i.e. a source terminal), and a second terminal (i.e. a drain terminal) coupled to the first output terminal OUTB. The fourth switch element 340, having a control terminal (i.e. a gate terminal) coupled to the first output terminal OUTB, a first terminal (i.e. a source terminal), and a second terminal (i.e. a drain terminal) coupled to the second output terminal OUT. The first current source module is coupled between a second voltage source VP and the first terminal of the third switch element 330, and is utilized for letting a current passing through the third switch element 330 smaller than a current passing through the first switch element 310 when the first switch element 310 and the third switch element 330 are conducted. The second current source module is coupled between the second voltage source VP and the first terminal of the fourth switch element 340, and is utilized for letting a current passing through the fourth switch element 340 smaller than a current passing through the second switch element 320 when the second switch element 320 and the fourth switch element 340 are conducted. In this way, it is also practical to let transitions of the output voltages of the first output terminal OUTB and the second output terminal OUT occur successfully when the level shift circuit operates at a low input voltage level.

For example, an initial state of the level shift circuit 300 is assumed as the following state: the first switch element 310 is not conducted (i.e. turned off); the second switch element 320 is conducted (i.e. turned on); the third switch element 330 is conducted; the fourth switch element 340 is not conducted; a voltage level of the first output terminal OUTB is equal to a voltage level of the second voltage source VP and a voltage level of the second output terminal OUT is equal to a voltage level of the first voltage source VN. When the first input signal IN turns on the first switch element 310 and the second input signal INB turns off the second switch element 320, the voltage level of the first output terminal OUTB is pulled down to the voltage level of the first voltage source VN faster, and thus it is very easily to turn on the fourth switch element 340, so as to let the voltage level of the second output terminal OUT be pulled up to the voltage level of the second voltage source VP, and complete the transition process.

Figure 4:
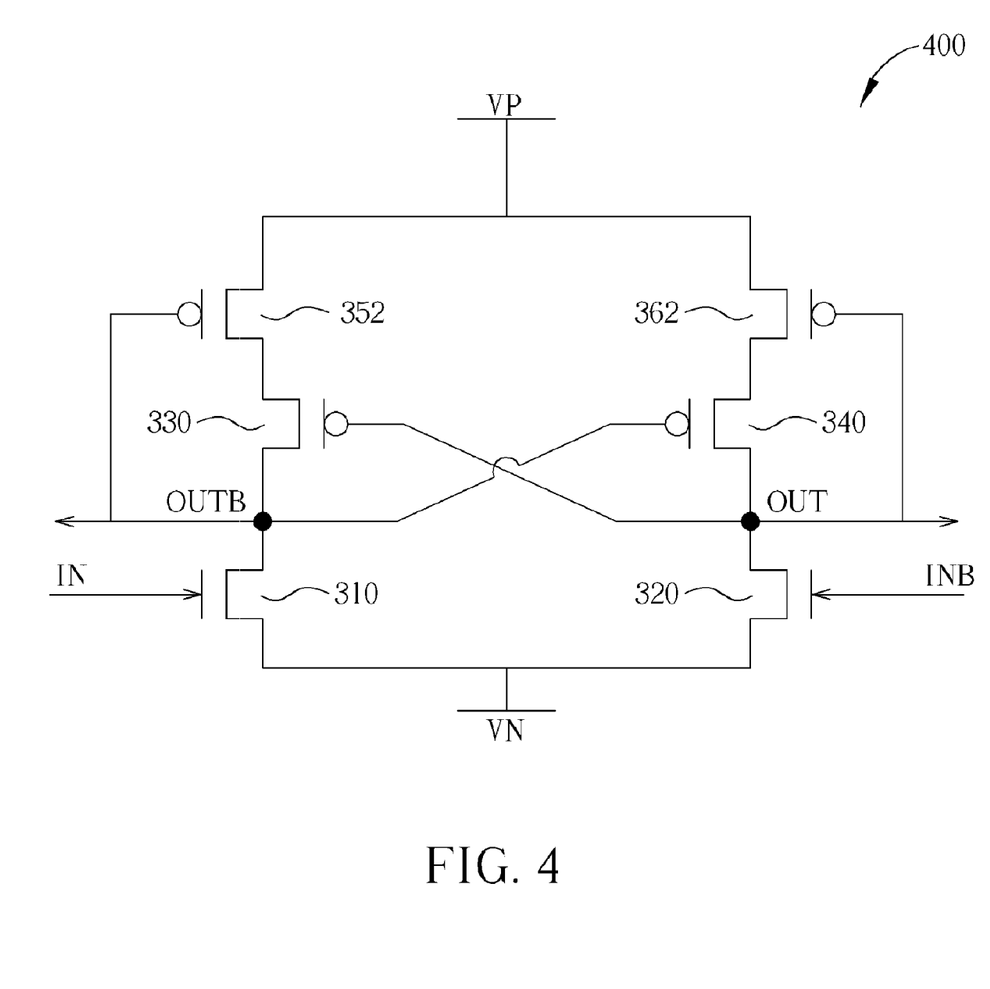
FIG. 4 shows a simplified block diagram of a level shift circuit in accordance with a second embodiment of the present invention.

In addition, in a second embodiment of the present invention, the first current source module 350 in the level shift circuit 300 can comprise a fifth switch element 352, and the second current source module 360 can comprise a sixth switch element 362. As shown in FIG. 4, the fifth switch element 352 and the sixth switch element 362 both are P-type FETs. The fifth switch element 352 has a control terminal (i.e. a gate terminal) coupled to the first output terminal OUTB, a first terminal (i.e. a source terminal) coupled to the second voltage source VP, and a second terminal (i.e. a drain terminal) coupled to the first terminal of the third switch element 330. The sixth switch element 362 has a control terminal (i.e. a gate terminal) coupled to the second output terminal OUT, a first terminal (i.e. a source terminal) coupled to the second voltage source VP, and a second terminal (i.e. a drain terminal) coupled to the first terminal of the fourth switch element 340. In addition, the threshold voltages of the fifth switch element 352 and the sixth switch element 362 both are equal to Vt. The second embodiment of the present invention is similar with the first embodiment of the present invention, and an initial state of the level shift circuit 300 in the second embodiment is assumed as the following state: the first switch element 310 is not conducted (i.e. turned off); the second switch element 320 is conducted (i.e. turned on); the third switch element 330 is conducted; the fourth switch element 340 is not conducted; the fifth switch element 352 is conducted; the sixth switch element 362 is conducted; a voltage level of the first output terminal OUTB is equal to a voltage level of the second voltage source VP minus Vt (i.e. VP+Vt) and a voltage level of the second output terminal OUT is equal to a voltage level of the first voltage source VN. When the first input signal IN turns on the first switch element 310 and the second input signal INB turns off the second switch element 320, the voltage level of the first output terminal OUTB is pulled down to the voltage level of the first voltage source VN faster, and thus it is very easily to turn on the fourth switch element 340, so as to let the voltage level of the second output terminal OUT be pulled up to the voltage level of the second voltage source VP minus Vt (i.e. VP+Vt), and complete the transition process.

Figure 5:
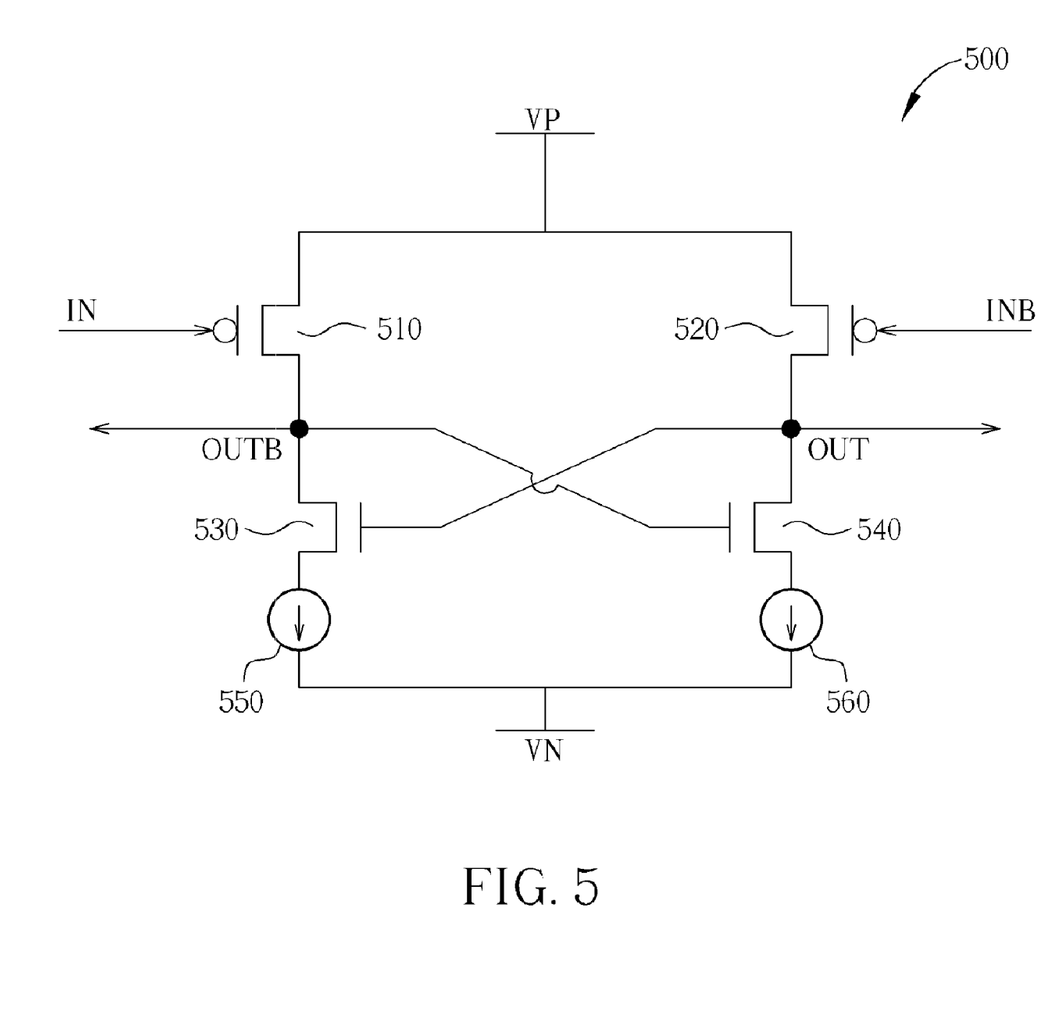
FIG. 5 shows a simplified block diagram of a level shift circuit in accordance with a third embodiment of the present invention.

Please refer to FIG. 5. FIG. 5 shows a simplified block diagram of a level shift circuit 500 in accordance with a third embodiment of the present invention. As shown in FIG. 5, the level shift circuit 500 comprises: a first switch element 510, a second switch element 520, a third switch element 530, a fourth switch element 540, a first current source module 550, and a second current source module 560, wherein a voltage level of a first voltage source VP is higher than a voltage level of the second voltage source VN. In addition, the first switch element 510 and the second switch element 520 both are P-type FETs, and the third switch element 530 and the fourth switch element 540 both are N-type FETs, and the level shift circuit 500 is a level pull-down circuit.

The first switch element 510 has a control terminal (i.e. a gate terminal) coupled to a first input signal IN, a first terminal (i.e. a source terminal) coupled to a first voltage source VP, and a second terminal (i.e. a drain terminal) coupled to a first output terminal OUTB. The second switch element 520 has a control terminal (i.e. a gate terminal) coupled to a second input signal INB, a first terminal (i.e. a source terminal) coupled to the first voltage source VP, and a second terminal (i.e. a drain terminal) coupled to a second output terminal OUT, wherein the second input signal INB is an inverse of the first input signal IN. The third switch element 530 has a control terminal (i.e. a gate terminal) coupled to the second output terminal OUT, a first terminal (i.e. a source terminal), and a second terminal (i.e. a drain terminal) coupled to the first output terminal OUTB. The fourth switch element 540, having a control terminal (i.e. a gate terminal) coupled to the first output terminal OUTB, a first terminal (i.e. a source terminal), and a second terminal (i.e. a drain terminal) coupled to the second output terminal OUT. The first current source module is coupled between a second voltage source VN and the first terminal of the third switch element 530, and is utilized for letting a current passing through the third switch element 530 smaller than a current passing through the first switch element 510 when the first switch element 510 and the third switch element 530 are conducted. The second current source module is coupled between the second voltage source VN and the first terminal of the fourth switch element 540, and is utilized for letting a current passing through the fourth switch element 540 smaller than a current passing through the second switch element 520 when the second switch element 520 and the fourth switch element 540 are conducted. In this way, it is also practical to let transitions of the output voltages of the first output terminal OUTB and the second output terminal OUT occur successfully when the level shift circuit operates at a low input voltage level.

For example, an initial state of the level shift circuit 500 is assumed as the following state: the first switch element 510 is not conducted (i.e. turned off); the second switch element 520 is conducted (i.e. turned on); the third switch element 530 is conducted; the fourth switch element 540 is not conducted; a voltage level of the first output terminal OUTB is equal to a voltage level of the second voltage source VN and a voltage level of the second output terminal OUT is equal to a voltage level of the first voltage source VP. When the first input signal IN turns on the first switch element 510 and the second input signal INB turns off the second switch element 520, the voltage level of the first output terminal OUTB is pulled up to the voltage level of the first voltage source VP faster, and thus it is very easily to turn on the fourth switch element 540, so as to let the voltage level of the second output terminal OUT be pulled down to the voltage level of the second voltage source VN, and complete the transition process.

Figure 6:
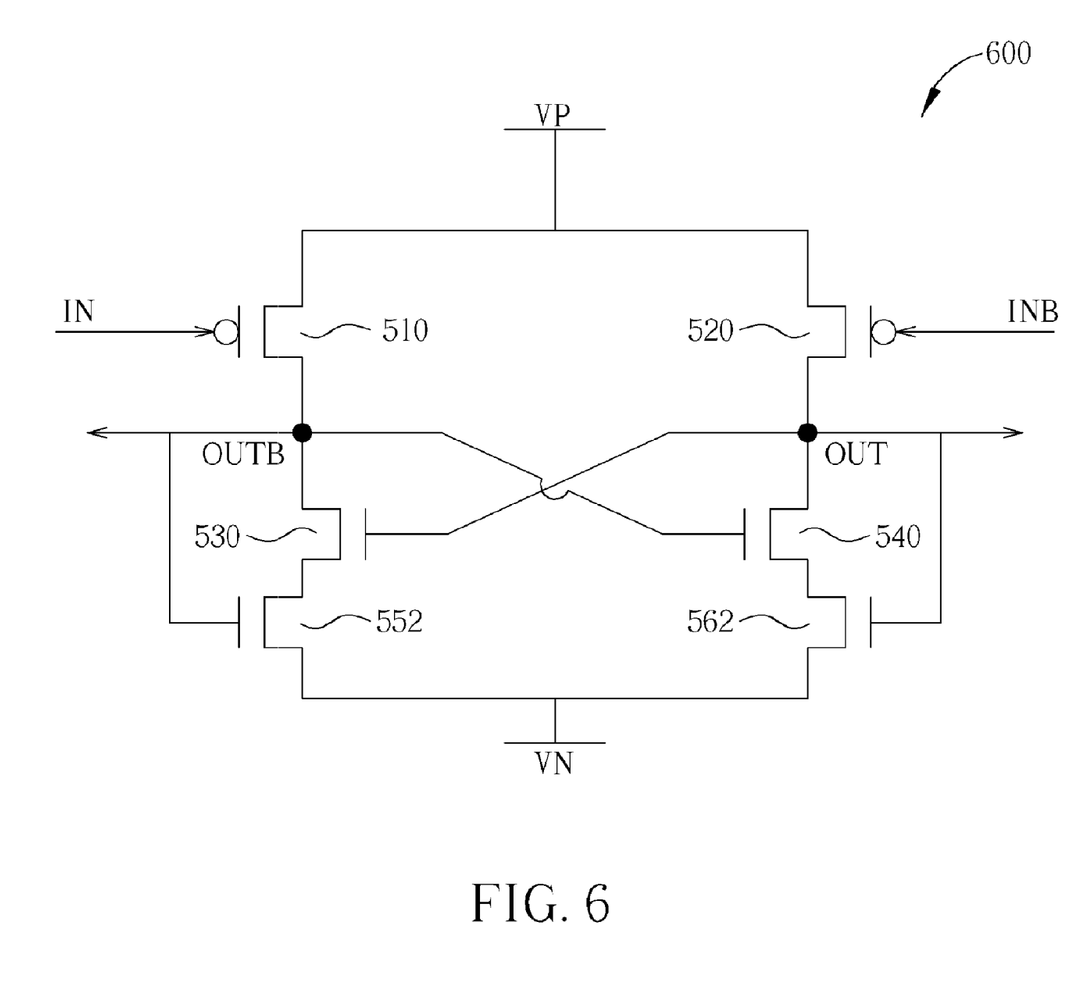
FIG. 6 shows a simplified block diagram of a level shift circuit in accordance with a fourth embodiment of the present invention.

In addition, in a fourth embodiment of the present invention, the first current source module 550 in the level shift circuit 500 can comprise a fifth switch element 552, and the second current source module 560 can comprise a sixth switch element 562. As shown in FIG. 6, the fifth switch element 552 and the sixth switch element 562 both are N-type FETs. The fifth switch element 552 has a control terminal (i.e. a gate terminal) coupled to the first output terminal OUTB, a first terminal (i.e. a source terminal) coupled to the second voltage source VN, and a second terminal (i.e. a drain terminal) coupled to the first terminal of the third switch element 530. The sixth switch element 562 has a control terminal (i.e. a gate terminal) coupled to the second output terminal OUT, a first terminal (i.e. a source terminal) coupled to the second voltage source VN, and a second terminal (i.e. a drain terminal) coupled to the first terminal of the fourth switch element 540. In addition, the threshold voltages of the fifth switch element 552 and the sixth switch element 562 both are equal to Vt. The fourth embodiment of the present invention is similar with the third embodiment of the present invention, and an initial state of the level shift circuit 500 in the fourth embodiment is assumed as the following state: the first switch element 510 is not conducted (i.e. turned off); the second switch element 520 is conducted (i.e. turned on); the third switch element 530 is conducted; the fourth switch element 540 is not conducted; the fifth switch element 552 is conducted; the sixth switch element 562 is conducted; a voltage level of the first output terminal OUTB is equal to a voltage level of the second voltage source VN plus Vt (i.e. VP+Vt) and a voltage level of the second output terminal OUT is equal to a voltage level of the first voltage source VP. When the first input signal IN turns on the first switch element 510 and the second input signal INB turns off the second switch element 520, the voltage level of the first output terminal OUTB is pulled up to the voltage level of the first voltage source VP faster, and thus it is very easily to turn on the fourth switch element 540, so as to let the voltage level of the second output terminal OUT be pulled down to the voltage level of the second voltage source VN plus Vt (i.e. VP+Vt), and complete the transition process.

Briefly summarized, the driving circuit disclosed by the present invention is capable of letting transitions of the output voltages of the first output terminal OUTB and the second output terminal OUT occur successfully when the level shift circuit operates at a low input voltage level.

Those skilled in the art will readily observe that numerous modifications and alterations of the device and method may be made while retaining the teachings of the invention.

What is claimed is:
1. A level shift circuit, comprising:
a first switch element, having a control terminal coupled to a first input signal, a first terminal coupled to a first voltage source, and a second terminal coupled to a first output terminal;
a second switch element, having a control terminal coupled to a second input signal, a first terminal coupled to the first voltage source, and a second terminal coupled to a second output terminal, wherein the second input signal is an inverse of the first input signal;
a third switch element, having a control terminal coupled to the second output terminal, a first terminal, and a second terminal coupled to the first output terminal;
a fourth switch element, having a control terminal coupled to the first output terminal, a first terminal, and a second terminal coupled to the second output terminal;
a first current source module, coupled between a second voltage source and the first terminal of the third switch element, for letting a current passing through the third switch element smaller than a current passing through the first switch element when the first switch element and the third switch element are conducted; and
a second current source module, coupled between the second voltage source and the first terminal of the fourth switch element, for letting a current passing through the fourth switch element smaller than a current passing through the second switch element when the second switch element and the fourth switch element are conducted;
wherein the first current source module comprises:
a fifth switch element, having a control terminal directly connected to the first output terminal, a first terminal coupled to the second voltage source, and a second terminal directly connected to the first terminal of the third switch element; and
the second current source module comprises:
a sixth switch element, having a control terminal directly connected to the second output terminal, a first terminal coupled to the second voltage source, and a second terminal directly connected to the first terminal of the fourth switch element.

2. The level shift circuit of claim 1, wherein the first switch element, the second switch element, the third switch element, the fourth switch element, the fifth switch element, and the sixth switch element all are transistors.

3. The level shift circuit of claim 2, wherein a voltage level of the first voltage source is lower than a voltage level of the second voltage source.

4. The level shift circuit of claim 3, wherein the first switch element and the second switch element both are N-type FETs, and the third switch element, the fourth switch element, the fifth switch element, and the sixth switch element all are P-type FETs, and the level shift circuit is a level pull-up circuit.

5. The level shift circuit of claim 2, wherein a voltage level of the first voltage source is higher than a voltage level of the second voltage source.

6. The level shift circuit of claim 5, wherein the first switch element and the second switch element both are P-type FETs, and the third switch element, the fourth switch element, the fifth switch element, and the sixth switch element all are N-type FETs, and the level shift circuit is a level pull-down circuit.

7. The level shift circuit of claim 1, wherein the first switch element, the second switch element, the third switch element, and the fourth switch element all are transistors.

8. The level shift circuit of claim 7, wherein a voltage level of the first voltage source is lower than a voltage level of the second voltage source.

9. The level shift circuit of claim 8, wherein the first switch element and the second switch element both are N-type FETs, and the third switch element and the fourth switch element both are P-type FETs, and the level shift circuit is a level pull-up circuit.

10. The level shift circuit of claim 7, wherein a voltage level of the first voltage source is higher than a voltage level of the second voltage source.

11. The level shift circuit of claim 10, wherein the first switch element and the second switch element both are P-type FETs, and the third switch element and the fourth switch element both are N-type FETs, and the level shift circuit is a level pull-down circuit.

* * * * *